United States Patent
Ausserlechner et al.

(10) Patent No.: US 7,302,357 B2
(45) Date of Patent: Nov. 27, 2007

(54) CONCEPT FOR COMPENSATING PIEZO-INFLUENCES ON AN INTEGRATED SEMICONDUCTOR CIRCUIT

(75) Inventors: Udo Ausserlechner, Villach (AT); Mario Motz, Wernberg (AT)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 11/426,201

(22) Filed: Jun. 23, 2006

(65) Prior Publication Data
US 2007/0018655 A1    Jan. 25, 2007

(30) Foreign Application Priority Data
Jun. 24, 2005  (DE) ..................... 10 2005 029 464

(51) Int. Cl.
*G01R 33/07* (2006.01)
(52) U.S. Cl. ............... 702/107; 324/251; 324/252; 324/225; 327/511; 257/427; 323/368; 323/293; 323/294
(58) Field of Classification Search ........... 702/107; 324/251–252, 225
See application file for complete search history.

(56) References Cited

U.S. PATENT DOCUMENTS 6,906,514 B2   6/2005   Ausserlechner ............ 324/251

2005/0162160 A1   7/2005   Ausserlechner et al. .... 324/251

FOREIGN PATENT DOCUMENTS

| DE | 101 54 495 A1 | | 5/2003 |
|---|---|---|---|
| DE | 101 54 497 A1 | | 5/2003 |
| DE | 101 54 498 A1 | | 5/2003 |
| DE | 102 23 179 A1 | | 12/2003 |
| DE | 102005029464.2 | * | 6/2005 |
| DE | 10 2004 003 853 A1 | | 8/2005 |
| EP | 1 496 344 A2 | | 7/2004 |
| WO | 03/040852 A2 | | 5/2003 |

* cited by examiner

*Primary Examiner*—John Barlow
*Assistant Examiner*—Sujoy Kundu
(74) *Attorney, Agent, or Firm*—Eschweiler & Associates, LLC (57) ABSTRACT

A compensation signal, which derives the mechanical stress, which acts on an integrated semiconductor circuit, from two partial compensation signals, which are generated by semiconductor elements with different stress characteristics, can be determined in more detail when the temperature dependence of a ratio of the partial compensation signals is also considered, wherein particularly a deviation of the ratio of the partial compensation signal to an ideal ratio is considered. Thereby, the rise in accuracy of the stress determination results from determining a deviation of the partial compensation signals, on which the stress determination is based, from a nominal behavior in a stress-free state, so that the deviation of the nominal behavior, which can be based, for example, on a variation of the process parameters in a production process of a semiconductor circuit, can also be considered, in addition to the known temperature behavior.

26 Claims, 3 Drawing Sheets

CONCEPT FOR COMPENSATING PIEZO-INFLUENCES ON AN INTEGRATED SEMICONDUCTOR CIRCUIT

CROSS-REFERENCE TO RELATED APPLICATIONS

This application claims priority from German Patent Application No. 102005029464.2, which was filed on Jun. 24, 2005 and is incorporated herein by reference in its entirety.

TECHNICAL FIELD

The present application relates to the compensation of piezo-influences on an integrated semiconductor circuit, particularly to a concept for compensating variations of electric parameters, to which circuit components integrated on a semiconductor circuit substrate are subject due to mechanical stress acting upon the semiconductor circuit substrate.

BACKGROUND

Integrated circuits on a semiconductor circuit substrate are often constructed in housings consisting at least of a semiconductor chip, a so called leadframe and a compound. In common production methods, first, the semiconductor chip is mechanically mounted on a chip island within the leadframe, wherein the semiconductor chip is additionally electrically bonded to a carrier board, such as a PCB, via a leadframe. For that purpose, a leadframe has several pins isolated from each other, wherein electric bonding between the pins of the leadframe and the corresponding terminal contacts is normally provided on a semiconductor chip via bonding. In order to protect the semiconductor chip and the bonding wires from adverse environmental influences, normally, the semiconductor chips and part of the leadframe are encapsulated with a compound, so that merely parts of the pins which are used for bonding with a board protrude from the compound material.

Thus, also from a mechanical point of view, a completely housed semiconductor chip is a complex construct consisting of different materials. Due to the different thermal extension coefficients of these materials, the individual components strain heavily against each other, wherein these strains can already occur during production. Thus, the surface of the semiconductor chip within the housing is under significant compressive/tensile stress in the order of 100 MPA. Additionally, these mechanical strains change with environmental conditions, such as temperature, air humidity or also through further processing of the member, such as cutting the member from the leadframe strip (typically at the semiconductor producer) or soldering the membrane to a carrier board in a module (mostly at the module producer). As an alternative to soldering the member, other bonding methods, such as overmolding, hot forming, or bending the pins are possible, which also apply mechanical stress on the member. Due to the above-described effects, the mechanical strain at the semiconductor is badly defined and not very constant.

Particularly, the mechanical strain of the semiconductor influences important parameters of members integrated in semiconductor circuit substrates, which is known in the art, for example, as piezo-resistive, piezo-MOS, piezo-Hall and piezo-junction effect. Particularly ultra precise analog semiconductor circuits—and here particularly sensors—are suffering from the fact that their offset or their sensitivity (e.g. the gain factor of an amplifier, the magnetic sensitivity of a magnetic field sensor, the output voltage of a voltage constant or the temperature code of a digital temperature sensor).

The piezo-effects on electric parameters of semiconductor circuits, which are significant for understanding the inventive thought, will be briefly described below.

Generally, a mechanical strain in a semiconductor material has the effect that the properties of the charge carriers change with regard to the charge carrier transport, such as the charge carrier mobility, the mean collision time, the scattering factor, etc.

Thereby, the piezo-resistive effect indicates generally how the specific ohmic resistance of the respective semiconductor materials behaves under the influence of a mechanical strain. Changes of the characteristic curves of diodes and bipolar transistors result, among others, from the piezo-junction effect. The piezo-Hall effect describes the dependence of the Hall constant of the semiconductor material on the mechanical strain state in the semiconductor material. The piezo-tunnel effect occurs at reverse-operated highly doped shallow lateral p-n junctions. This current is dominated by band-to-band tunnel effects and also stress-dependent.

The piezo-resistive effect and the piezo-MOS effect that can sometimes be found in literature can be classified comparably, since the mobility of the charge carriers in the MOS channel of a MOS field-effect transistor changes under the influence of mechanical stress in the semiconductor material of the integrated circuit chip with the Piezo-MOS effect in the same way as with the piezo-resistive effect.

Thus, it becomes clear that the electric or electronic characteristics of the integrated circuitry can be altered due to mechanical strains in the semiconductor material of an integrated circuitry, wherein then a decrease in performance of the integrated circuitry can be observed, for example in the form of an impairment of the dynamic range, the resolution, the bandwidth, the power consumption or the accuracy, etc.

In particular, the above-mentioned piezo-resistive effect indicates how the specific ohmic resistance $\rho$ of the respective semiconductor material behaves under the influence of a mechanical stress tensor $\sigma$ and the piezo-resistive coefficient $\pi$:

$$\rho = \rho_0(1+\Sigma \pi_{i,j} \sigma_{i,j})$$

Thereby, the factor $\rho_0$ is the basic value of the specific resistance, which remains uninfluenced by the mechanical strain.

In integrated circuits (ICs), a required current I, e.g. a control current, a reference current, etc., may be normally generated by circuit elements of the integrated circuit on the semiconductor chip. Thereby, substantially, a defined voltage U is applied to an integrated resistor with the resistance R and the current I flowing then is coupled out. Thus, generally, a current I can be generated at any resistive element, e.g. also at an MOS field-effect transistor, which is in the linear operating range.

The voltage U can be generated, for example, relatively constant by known bandgap principles with regard to mechanical strains in the semiconductor material (despite comparatively small piezo-junction effects on the generated bandgap voltage). However, the resistance R is subject to the piezo-resistive effect according to the above equation:

$$R = R_0(1+\Sigma \pi_{i,j} \sigma_{i,j})$$

Thereby, the factor $R_0$ is the basic value of the resistance, which remains uninfluenced by the mechanical strains, and the value $\pi_{ij}$ is a piezo-resistive coefficient. Thus, the current I generated at the resistive element can be expressed as follows:

$$I=U/R=U/(R_0(1+\Sigma\pi_{ij}\sigma_{ij}))$$

The piezo-Hall effect describes the dependence of the Hall constant $R_h$ on the mechanical stress state in the semiconductor material, with:

$$R_h=R_{h0}(1+\Sigma P_{i,j}\sigma_{i,j})$$

Thereby, $\sigma_{ij}$ is the mechanical stress tensor, $P_{ij}$ are the piezo-Hall coefficients, summing is performed via i,j=1 . . . 3.

Both the piezo-resistive effect and the piezo-Hall effect are spurious during the operation of an integrated circuit, particularly a sensor circuit, such as an integrated Hall probe including control and evaluation electronic.

The piezo-Hall effect, which also occurs due to mechanical strains in the semiconductor material of the semiconductor chip of the integrated circuit, changes, for example, the current-related sensitivity $S_i$ of the Hall probe as follows:

$$S_i = \frac{U_h}{I_H B} = \frac{R_h}{t}g$$

Thereby, $U_h$ is the Hall voltage at the output side of the Hall probe, $I_H$ is the current (control current) through the Hall probe, B is the magnetic flow density to be detected, t is the effective thickness of the active layer of the Hall probe and g is a geometry factor describing the influence of the contact electrodes on the Hall voltage.

As additional complication, the Hall current $I_H$ through the Hall probe changes due to the piezo-resistive effect, when mechanical strains are applied in the semiconductor material of the Hall probe array, when the Hall current $I_H$ (control current) is defined, for example, across an integrated resistor R, where a voltage U is dropped, for example via a locked loop. Thus, a change of the Hall current $I_H$ due to a resistor change caused by the piezo-resistive effect leads to a change of the sensitivity S of the Hall probe, the sensitivity S of the Hall probe is the product of current-related sensitivity $S_i$ and Hall current $I_H$:

$$S=S_iI_H=U_h/B\propto S_i/R$$

The magnetic sensitivity S of the Hall probe defines (as indicated above) the relation of the output voltage $U_H$ of the Hall probe to the influencing magnetic field component B.

A mechanical strain $\sigma_{ij}$ in the semiconductor material of the Hall probe arrangement influences the current-related magnetic sensitivity $S_i$ of a Hall probe according to:

$$S_i=S_{i0}(1+\Sigma P_{ij}\sigma_{ij})$$

Here, the factor $S_{i0}$ is the basic value of the current-related magnetic sensitivity, which remains uninfluenced by the mechanical strain, and the factor $P_{ij}$ is a piezo-Hall coefficient.

Generally, an attempt is made to maintain the magnetic sensitivity S of a Hall probe as constant as possible, wherein particularly influences based on mechanical strain due to the above described piezo-resistive effects and the piezo-Hall effects are spurious.

With regard to the above-described piezo-effects, it should be noted that the coefficients $\sigma_{ij}$, $P_{ij}$ and $\pi_{ij}$ describing the mechanical strains occurring in the semiconductor material are elements of tensors, i.e. that the current-related magnetic sensitivity $S_i$ of a Hall element and the resistance R of a resistive element do not change only by the strength of the mechanical strain in the semiconductor material but additionally in dependence on the strain direction in the semiconductor material. The distinct directional dependence of the influence of a mechanical strain in the semiconductor material on electric and electronic parameters of an integrated circuit are known in the art.

Since the piezo-effects are directional, as described above, which means they depend on the relative orientation of a semiconductor element with regard to the crystal structure of a semiconductor substrate, the crystallographic orientations relevant in the production of integrated semiconductor circuits will be described below.

Figure 3A:
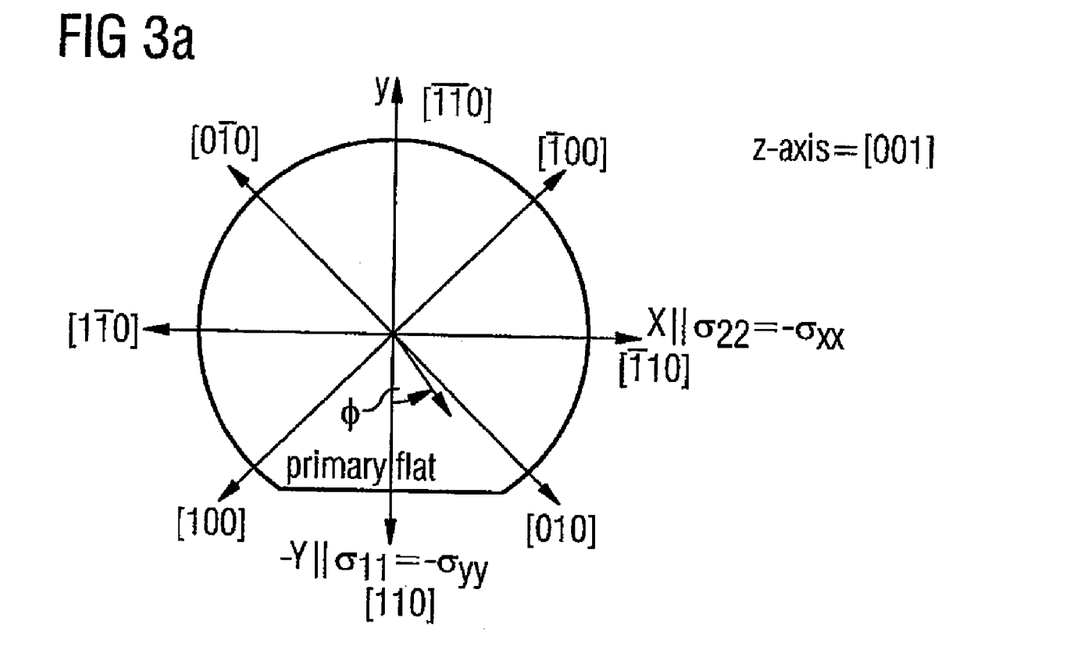
FIGS. 3a-3b are direction designations of the preferred directions within the semiconductor crystal.

For producing integrated circuits, the semiconductor wafers, e.g. silicon wafers or silicon slices, respectively, are sawn from a single crystal rod, such that the wafer surface is associated to a crystallographic plane. In order to determine the respective plane in a cubic crystal, the so called "Miller indices" are used, which are indicated below in round brackets. FIG. 3a shows, for example, a top view of a semiconductor wafer which is cut in the (100) plane.

Figure 3B:
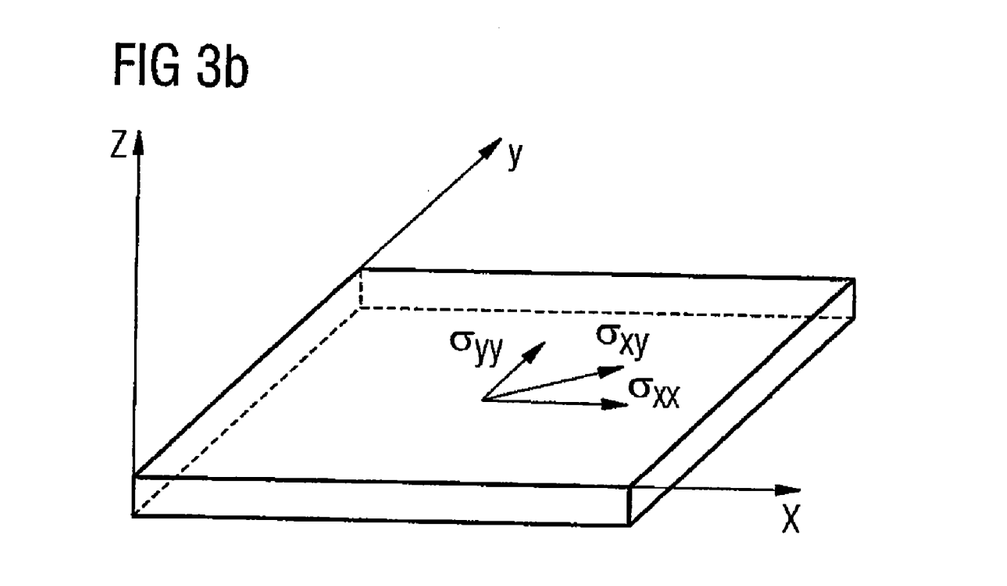

Further, the major crystallographic directions in the wafer plane are indicated in FIGS. 3a-b, wherein the producers of these silicon wafers provide a so-called "primary flat" at the silicon slice. Normally, the edges of the square geometries of the circuit structures run on the semiconductor chip in parallel or perpendicular, respectively, to the primary flats. In FIG. 3a, particularly, the crystallographic directions or axes, respectively, are illustrated in the plane of the semiconductor wafer, wherein the same are illustrated below in square brackets. The coordinate system is usually used such that the [100] direction runs perpendicular to the primary flat, while the [$\bar{1}$11] direction runs parallel to the primary flat. The directions [010] and [100] run in an angle of +/−45° to the [110] direction.

Further, an angle $\phi$ is defined with respect to the [110] direction, wherein in the top view on the wafer surface, the angle $\phi$ is counted counter-clockwise starting from the [110] direction. Normally, the individual chips at the wafer are positioned such that the directions $\phi=0°$ and $\phi=90°$ correspond to the IC vertical or horizontal direction, respectively, wherein these directions can be exchanged, depending on whether the IC is on edge or horizontal. Further, the direction $\phi=90°$ will be designated below as x-axis ([$\bar{1}$10] direction) and the direction $\phi=0°$ as negative y-axis ([110] direction).

Since {100} silicon material is used in the plurality of applications for integrated semiconductor circuits, the following explanations mainly relate to the numbers for {100} silicon material, which are relevant for this material, in order to simplify the explanations and due to the specific practical importance. However, it should be clear that other semiconductor materials or other silicon materials can also be used.

Since an integrated circuit chip is generally structured in a layered way in the housed state, the description can be limited to a planar stress state, namely two normal stress components $\sigma_{xx}$, $\sigma_{yy}$ and one shear stress component $\sigma_{xy}$, as illustrated exemplarily with regard to FIG. 3b. Here, according to definition, the x and y axes are arranged in parallel to the edges of the semiconductor circuit chip. The other stress components are substantially negligibly small and have only little influence on the electric circuit components. In a sufficiently high distance to the edge of the semiconductor circuit chip and particularly in the middle of a semiconductor circuit chip, the shear stress component $\sigma_{xy}$ is also mostly negligibly small. Thus, substantially, only the two normal stress components $\sigma_{xx}$ and $\sigma_{yy}$ remain.

According to the above definition, in the mostly used {100} silicon semiconductor material, the x-axis is parallel to the [$\bar{1}$10] direction, and the y-axis is parallel to the [$\bar{1}$10] direction.

The electronic function parameters of different integrated devices or semiconductor devices, respectively, show the dependences on the above illustrated normal stress components $\sigma_{xx}$ and $\sigma_{yy}$ in {100} silicon, which will be discussed in detail below.

In the following, first, resistive elements, such as resistor elements, MOS-FETs, etc. and particularly the influence of the piezo-resistive effect on the resistance of a resistive element will be discussed.

If the mechanical stress $\sigma$ on the semiconductor chip changes, the resistance changes also due to the piezo-resistive effect according to the following equation:

$$\delta R = \frac{\Delta R}{R} = \frac{R(\sigma) - R(\sigma = 0)}{R(\sigma = 0)}$$

The alignment of a resistor element on the semiconductor chip is indicated as angle $\phi$ in relation to the [110] direction in the crystal. Here, the [110] direction is perpendicular to the primary flat of the semiconductor wafer and thus clearly defined (see FIG. 3a).

If two resistors, normally of the same size but rotated by 90° in the layout, are connected in series, the stress dependence can be reduced. The same applies for connecting two resistors rotated by 90° in parallel.

It can be shown that the series connection of two resistors with orthogonal layout is independent of a rotation of the whole arrangement by +/−45° with regard to mechanical strains. Such an arrangement will be referred to as "L-layout" below. The resulting resistor of the arrangement is even independent of the angle $\phi$.

In summary, it can be said with regard to diffusion or implantation resistors, respectively, on the semiconductor circuit chip, that the stress-dependence of the resistance depends on the orientation of the resistor in the xy plane of the semiconductor circuit chip depends, so that particularly a resistor is not only sensitive to the sum of the normal stress components.

Alternatively, a so called L-resistor arrangement of two resistors can be provided, i.e. two resistors of the same size, which are arranged perpendicular and immediately adjacent to each other, are connected electrically in series or in parallel. Here, the L-resistor circuit can be rotated in any way in the (100) plane without any changes of its piezo-properties or dependences, respectively. This L-resistor circuit is preferred compared to a single resistor in a (100) direction, since the L-resistor circuit is substantially the only one being insensitive to the shear stress component in the semiconductor material of the semiconductor circuit chip.

For a stress dependence of an L resistor circuit, the following relation results:

$$R_L = R_{L0}(T)\left(1 + \frac{\pi_{11}(T) + \pi_{12}(T)}{2}(\sigma_{xx} + \sigma_{yy})\right)$$

Here, the factor $R_{L0}(T)$ indicates the resistance of the L resistor circuit at miniscule mechanical stress in the semiconductor material of the semiconductor circuit chip. In this context, it should be noted that the basic resistance $R_{L0}(T)$ is already temperature-dependent. In an L resistor arrangement in the (100) plane, factors $\pi_{11}(T)$ and $\pi_{12}(T)$ are the only relevant terms of the piezo-resistive tensor. These two relevant terms of the piezo-resistive tensor also show a certain temperature-dependence.

With regard to the piezo-resistive effect, a special form of resistor elements, namely polysilicon resistors, will be discussed. Polysilicon resistors are not simply diffused or implanted, respectively, into the single crystal material of the semiconductor circuit chip, but are grown on the semiconductor surface of the integrated semiconductor chip. Thereby, generally, a dielectric lies between the single-crystal semiconductor material and the polysilicon trace of the polysilicon resistor. Now, the stress dependence of polysilicon resistors depends no longer on the direction of the polysilicon resistor trace on the semiconductor surface, due to the statistic directional distribution of the many single grains in the poly-semiconductor material (polysilicon material). Thus, a polysilicon resistor shows a substantially similar piezo-resistive dependence as an L-resistor circuit of diffusion or implantation resistors, respectively.

In the following, the influence of mechanical strains in a semiconductor material on the Hall-constant in the semiconductor material will be discussed, wherein this dependence will be described through the piezo-Hall effect. Particularly the current-related magnetic sensitivity $S_i$ of a Hall probe is influenced by the piezo-Hall effect, due to mechanical strain $\sigma$ in the semiconductor material of the semiconductor circuit chip, according to the following equation:

$$S_i = S_{i0}(1 + P \times \sigma).$$

By considering a planar stress state in the semiconductor chip of a Hall probe and by neglecting the shear stress component, while the Hall probes are sufficiently distant from the edge of the semiconductor circuit chip, so that according to the invention only the two normal stress components $\sigma_{xx}$, $\sigma_{yy}$ may be required for describing the mechanical stress tensor, the following current-related magnetic sensitivity $S_i$ of a Hall probe results:

$$S_i = S_{i0}(T)(1 + P_{12}(T)(\sigma_{xx} + \sigma_{yy}))$$

In the above equation, the factor $S_{i0}(T)$ represents the current-related magnetic sensitivity in a miniscule mechanical stress, wherein it should be noted here as well that the basic value of the $S_{i0}(T)$ is already temperature-dependent. Here, the factor $P_{12}(T)$ indicates the only relevant coefficient term of the piezo-Hall tensor, which again has a certain temperature dependence. Thus, even with a Hall probe in a semiconductor circuit chip, it results that only the sum of the two normal stress components $\sigma_{xx}$ and $\sigma_{yy}$ enters the above equation for the current-related magnetic sensitivity $S_i$ of a Hall probe.

Apart from Hall probe arrangements, there are other magnetic field sensors, such as MAG FETs or magneto diodes, wherein all these elements have the same property in that, through the Hall effect, the charge carriers flowing through the magnetic field sensor element in the semiconductor material are influenced by a magnetic field. All stated elements have piezo-influences, which are described by the piezo-Hall coefficient or similar coefficients, i.e. the influence of mechanical strains in a semiconductor material on the above-mentioned magnetic field sensitive elements is not described by the piezo-resistive effect alone.

In order to correct the above-described piezo-effects, which influence the read-out accuracy of semiconductor sensors, such as Hall sensors, a range of approaches and concepts exist in the prior art.

International patent application WO 2003040852-A2 describes a system, which detects mechanical stress acting on the semiconductor circuit substrate, wherein this stress influences a useful signal (particularly a magnetic field sensor). The mechanical stress directly measured at the chip is evaluated by a processing means, which influences the useful signal based on the detected mechanical stress and thus realizes a piezo-compensation. Thus, the method is based on directly measuring the mechanical stress acting on the semiconductor chip and to derive the influence which the measured stress has on the semiconductor sensor via a known function from the measured stress, so that the signal measured from the semiconductor sensor can be corrected by the predicted stress component.

European patent application 1 496 344 A2 describes how signals are generated with resistor Ls of two different conductivity types (n- and p-doping), which can be combined to an overall signal by appropriate weighting and summing/subtraction, which has a predeterminable dependence on mechanical stress (and particularly can also be stress-independent). The principle is to combine two resistors, which have been produced in different technology, namely an n- and a p-doped resistor, and which consequently have different piezo-resistive properties, such that a signal generated via both resistor types either forms a temperature-independent stress signal or represents a stress-independent temperature signal. Here, additionally, the two resistor types are formed by two subresistors of the same technology connected in series or in parallel, so that the overall resistor formed of the two subresistors is merely piezo-sensitive to the normal component of the mechanical stress.

Under the assumption that the two resistors of different conductivity types behave with regard to their electric properties as shown by literature values, a temperature-dependent stress signal or a stress-independent temperature signal can be generated by a different combination of the two subsignals. Further, EP 1 496 344 A2 describes that a resistor configuration whose piezo-properties only depend on the sum of normal stresses, can also be generated by forming so called "Van Der Pauw" structures on the semiconductor. The basic mode of operation of the Van Der Pauw structures is that a resistor element is operated in a clocked way, wherein the current flow is controlled such that in a first clock, the current flow is primarily generated in a first direction by the Van Der Pauw structure, wherein the first direction is perpendicular to a second direction, which indicates the primary current direction in the second clock. If the resistor, as it is measured in two subsequent clock periods, is averaged, the same will only depend on the sum of the normal stress components in the chip plane.

The usage of Van Der Pauw structures is also proposed in DE 102 23 179 A1, wherein the invention described therein aims to provide a semiconductor structure whose stress sensitivity has the same directional dependence like a semiconductor sensor to be stress-compensated, particularly like a Hall sensor, so that the semiconductor structure described therein is also sensitive to the normal stress components of the stress.

The German patent application DE 101 54 497 A1 describes also how integrated semiconductor resistors can be arranged advantageously with regard to their preferred current flow direction in relation to the crystal grid, so that the piezo-resistivity of the integrated resistors shows a dependence on a preferred direction, which can be freely determined. The resistor elements (L resistor arrangement) proposed there, which consist of two subresistors arranged in 90° angle to each other, are sensitive to the sum of the normal stress components in the chip surface, wherein, additionally, some circuit-technological equivalents to the L-resistor arrangements are shown in DE 101 54 497 A1, which have the desired piezo-sensitivity.

With regard to the stress dependence of the operating parameters of semiconductor sensors, it has to be noted that not only the semiconductor sensors themselves depend on mechanical stress acting on the semiconductor substrate, but that also their supply voltage or supply current, respectively, which is generated on the semiconductor substrate, has a stress dependence. Thus, it is desirable, for example for Hall sensors, that the Hall sensor is fed with current that is as constant as possible. Voltages can be generated mostly stress-independent via known bandgap circuit principles, the temperature dependence of the generated voltages can even be freely determined within broad limits. Currents which, among other things, serve to supply Hall sensors, are generated by a voltage drop across a resistor implanted on the semiconductor substrate, and thus the currents across the piezo-resistivity of the resistors are also stress-dependent.

The so-far unpublished patent application with the file number DE 10 2004003853.8 describes a semiconductor circuit, two subcurrents in a ratio 1:1.694 are obtained from a p- and n-doped diffusion/implantation resistor, which are laid out in the shape of an L, wherein these subcurrents are subsequently subtracted and the difference of the subcurrents is used as supply current of an n-doped Hall probe in {100} silicon. This semiconductor circuit achieves that the piezo-resistive effect in the two resistors, and thus the supply current mostly cancels out with the piezo-Hall effect of the Hall probe, so that the magnetic overall sensitivity of the semiconductor circuit is mostly independent of mechanical stress.

The methods or circuits, respectively, according to the prior art thus aim to measure the mechanical stress on a semiconductor substrate defect and to correct the influence of the mechanical stress on the sensor result with regard to the measured stress and an empirically determined stress dependence of the sensor to be compensated. On the other hand, the methods aim to develop circuits, which can provide the operating currents and supply voltages of semiconductor sensors independent of mechanical stress, so that the measurement result is not corrupted merely by varying the operating parameters of the sensor.

Here, the high temperature-dependence of the resistances of integrated resistors generally represents a great problem, which has to be considered to determine the mechanical stress with resistors, as it is partly the case in the above cited references, or to characterize a current generated via resistor circuits with regard to its temperature behavior.

Based on a calculation example for the measurement accuracy of an n-doped Hall probe, the problem will be illustrated briefly below. Since integrated resistors generally have distinct temperature dependences, care has to be taken that the small changes of the resistors due to mechanical stress can be distinguished from the comparatively higher changes of the resistors due to temperature. A small n-doped Hall probe in {100} silicon, for example, changes its current-related sensitivity by 1%, when the sum of the normal stress components, which means the mechanical stress, in the silicon surface changes at the position of the probe by 22 MPA. Thereby, with this mechanical stress, the resistor of a p-doped L-resistor arrangement changes by 0.06%, the one of an n-doped L-resistor arrangement by −0.54%. Thus, the difference between a first current through the p-doped resistor and a second current through the n-doped resistor changes by 0.6%. Thus, there is a problem, for example in that the Hall probe which is to be compensated with regard to stress drift, is almost twice as sensitive to mechanical stress than the stress sensor itself, which consists of n-and p-resistors. Additionally, there are the high temperature dependences of the n- and p-resistors. The temperature coefficients which indicate the relative resistor change in dependence on the temperature, lie between 0.25/° C. and 0.5%/° C. with the p- and n-resistors. Thus, a temperature change of 1 to 2° C. is sufficient to change the resistors by 0.6%, a change which corresponds to the selected stress change of 22 MPA, which cannot be distinguished from a "real" stress change without appropriate measures.

Since, according to the prior art, a mechanical stress on a semiconductor substrate is determined via implanted resistors of different types (n- and p-type), it becomes evident by the above calculating example that the temperature dependence of the implanted resistors has to be considered in stress determination, to obtain a relative measurement accuracy of a sensor circuit, which may satisfy the requirements of the desired application. At present, a relative measurement accuracy of 1% may be required with Hall sensors. The temperature dependence of the resistor of an implanted n- or p-type resistor is so high that even small deviations from an idealized assumed temperature behavior of the resistors could already cause that the measurement result of an integrated semiconductor circuit comprising a sensor may no longer fulfill the accuracy requirements made on the measurement result.

The method or circuit, respectively, proposed in unpublished patent application DE 102004003853.8, which partly compensates a stress-induced change of the sensitivity of a Hall probe by an appropriate change of the supply current of the Hall probe, has the disadvantage that the system is, on the one hand, difficult to characterize and thus to align (particularly when the piezo-compensation is to be performed across a wide temperature range), and that, on the other hand, it effects an insufficient compensation with scatterings of the temperature coefficients of the layer resistors of both resistor types (an n- and p-type).

The integrated semiconductor arrangement and the method for generating a pressure-dependent signal proposed in EP 1 496 344 A2 generates an output signal, which is stress independent, but still dependent on the temperature. There, it is not realized that the remaining temperature dependence represents a large problem that has to be controlled for piezo-compensation. Particularly, there is no realization that this temperature-dependence comprises process-induced scattering, which leads to an error term in stress determination.

SUMMARY

According to a first embodiment, an apparatus for determining a compensation signal, comprises: a means for providing first and second partial compensation signals, wherein the first and second partial compensation signals have a different mechanical stress dependence; a combination means for combining the first and second partial compensation signals into an intermediate compensation signal; a temperature detection means for detecting a temperature of a semiconductor circuit substrate; a means for providing a deviation signal, wherein the deviation signal comprises information about the deviation of a real ratio of the first and second partial compensation signals from a set ratio of the same at a reference temperature; a preprocessing means, which is implemented to form a corrected deviation signal considering the detected temperature from the deviation signal, under consideration of the detected temperature; and an evaluation means, which is implemented to provide the compensation signal based on the intermediate compensation signal and the corrected deviation signal, which is a measure for the mechanical stress acting on the semiconductor circuit substrate.

According to another embodiment, a method for determining a compensation signal, comprises the steps of: providing first and second partial compensation signals, wherein the first and second partial compensation signals have a different mechanical stress dependence; detecting a temperature of a semiconductor circuit substrate; combining the first and second partial compensation signals into an intermediate compensation signal; providing a deviation signal, wherein the deviation signal comprises information about the deviation of a real ratio of the first and second partial compensation signals from a set ratio of the same at a reference temperature; preprocessing the deviation signal to form a corrected deviation signal considering the detected temperature from the deviation signal under consideration of the detected temperature; and evaluating the intermediate compensation signal to provide a compensation signal based on the intermediate compensation signal and the corrected deviation signal, which is a measure for the mechanical stress acting on the semiconductor circuit substrate.

BRIEF DESCRIPTION OF THE DRAWINGS

These and other objects and features of the present invention will become clear from the following description taken in conjunction with the accompanying drawings, in which.

DETAILED DESCRIPTION

The present application is based on the findings that a compensation signal, which describes the mechanical stress acting on an integrated semiconductor circuit, and which is formed of two partial compensation signals, which are generated by semiconductor devices with different stress characteristics, can be determined more exactly by also considering the temperature-dependence of a ratio of the partial compensation signals, wherein particularly the temperature-dependence of a deviation of the ratio of the partial compensation signals from an ideal ratio is considered. The increase of accuracy of the stress determination results from determining a deviation of the partial compensation signal, on which the stress determination is based, from a nominal behavior in a stress free stage, so that the deviation of the nominal behavior, which can for example, be based on a variation of the process parameters in the production process of a semiconductor circuit, can be considered in addition to the temperature behavior, which is assumed to be known, so that the compensation signal, which describes the strength of the mechanical stress acting on the semiconductor circuit can be determined with higher accuracy.

A concept for compensating piezo-influences on an integrated semiconductor circuit is described, which allows piezo-compensation by a correction calculation of a useful signal, preferably in digital form.

A concept will be described below based on a system, which provides a useful signal, which is to be corrected for error influences based on piezo-effects. Thereby, in one embodiment, the system provides a useful signal, which shows a reduced temperature dependence from the beginning, or whose temperature dependence is precompensated, respectively. Such a system can be analyzed more easily and the coefficients of a mathematical function for optimum stress compensation can be determined more easily. Particularly, the system described below can provide a better piezo-compensation with process-induced scatterings of the temperature coefficients of layer resistors.

Although the concept for compensating piezo-influences on integrated semiconductor circuits can be applied to any sensor that can be integrated on a semiconductor substrate, the application will be described below with regard to the compensation of a read-out signal of a Hall sensor.

An embodiment or a possible realization, respectively, of the inventive concept for compensating piezo-influences can comprise the following components or functional blocks:

a) a first circuit block for generating a temperature-dependent current/voltage via a first resistor type, which has a first piezo-dependence;

b) a second circuit block for generating a temperature dependent current/voltage via a second resistor type, which has a second piezo-dependence;

c) a useful device, whose influence is to be compensated/reduced by mechanical stress (this is, e.g., in the case of an integrated Hall sensor, the Hall probe and its current/voltage supply), wherein the useful device, the first resistor type and the second resistor type have to be arranged at the chip such that they are subject to preferably identical mechanical stress (normal strain stress and not shear stress) and preferably identical temperature;

d) an adjusting means, which sets the ratio of the currents of the first and second circuit block at a reference temperature into a certain proportion. This adjusting means can, for example, be a digitally adjustable current mirror, where the current mirror ratio can be adjusted in fine stages by controlling with a digital code, by connecting or disconnecting small transistors at the input or output of the current mirror. Thereby, it is significant for the inventive concept for compensating piezo-influences on an integrated semiconductor circuit, that this adjusting is controlled by an adjusting signal—for example the above-mentioned digital code—and that this adjusting signal is further used in compensation. Thereby, the adjusting signal is a measure how the ratio of the layer resistors of the first resistor type and the second resistor type scatters from the nominal relation due to variations of the production process;

e) a circuit block forming a combination and particularly the difference (or the quotient) of the currents of the first circuit block and the second circuit block, wherein the combination of these currents results in a stress-dependent signal. This can be realized, for example, via an A/D converter, which outputs the difference of the currents as digital code;

f) a circuit block which determines the average temperature of the first circuit block, the second circuit block and the useful device, such as a digital temperature sensor, which outputs the temperature in a coded way in the form of a digital signal;

g) a calculating unit, which evaluates the stress-dependent signal with the average temperature and the adjusting signal, and thus performs a temperature compensation of the stress-dependent signal;

h) a calculating unit, which evaluates the temperature-compensated stress-dependent signal, the stress signal, again with a temperature-dependent function, to thereby reproduce the influence of the mechanical stress on the useful signal, and to determine a stress portion of the useful signal, i) a calculating unit, which evaluates the useful signal with the stress portion of the useful signal, and thereby calculates the influence of the mechanical stress on the useful signal via the stress portion of the useful signal.

Here, it has to be noted that the two resistor types of the first and the second circuit block both have to be sensitive to that component of the mechanical stress, to which the useful parameter (the magnetic sensitivity in the example of a Hall sensor) or the useful signal, respectively, is sensitive as well. The integrated Hall probes in {100} silicon, serving as examples, are sensitive to the sum of the normal stresses in the chip surface. Thus, the two resistor types also have to be sensitive to the sum of the normal stresses, which can be ensured by an L-shaped layout of each of the two resistors. Thereby, ideally, the first and second resistor type have a preferably similar temperature behavior and a preferably different sensitivity to mechanical stress. In practice, however, mostly the temperature dependence of the two resistor types is not very similar, which reduces the accuracy of the stress detection. The varying sensitivity to mechanical stress is, for example, given in n- and p-doped diffusion/implantation resistors in L-layout and with moderate dopings (smaller than $10^{16}$ cm$^3$), in that the former have a change of −24.4%/GPA, and the latter a change of +2.75%/GPA, thus they differ both in amount and sign.

In one embodiment, the currents in the first and second circuit block, respectively, are generated by a voltage drop across resistors of different technology. Thereby, the voltage dropping across the resistors, is generated by known bandgap circuit principles, wherein the temperature curve of the voltages generated by a bandgap circuit can be shaped almost arbitrarily, by mixing PTAT and VBE portions of voltages. PTAT means "proportional to absolute temperature". VBE is the base emitter voltage of a bipolar transistor and has negative temperature coefficients, contrary to PTAT, which has positive temperature coefficients, so that the PTAT voltage increases with increasing temperature. Thereby, the temperature dependences of the first and second current (the currents generated in the first and second circuit blocks) are preferably set such that, in the stress-free state, the stress-dependent signal is as small as possible in the whole operating temperature range. Thereby, the temperature error of the stress sensor, which means the circuit block providing the stress-dependent signal is minimized.

According to one embodiment, the resistor type in the first circuit block is a p-doped diffusion or implantation resistor, which is laid out in the shape of an L, and wherein both legs of the L are connected in series or in parallel, or wherein a temporal averaging of the two resistors, arranged rectangular to each other, is performed by a clocking scheme. Accordingly, the resistor type of the second circuit block is formed in a different technology, namely as n-doped diffusion or implantation resistor, which is laid out in the form of an L, or is operated in the just described circuit variation, respectively, to obtain a stress sensibility with regard to the normal stress component. In a variation of the above-described layout, with lower accuracy requirements, both resistor types can also be oriented in a single direction, a p-doped resistor for example in the <100> direction.

As has been described above, the two currents in the first and second circuit block are generated with the help of technologically different resistors, and thus, their ratio is subject to very large process-induced scatterings. The standard deviation of the scattering is thereby typically in the range of 5 to 10%. The above-described adjusting of the stress-dependent signal, which means the adjusting of two currents, is performed via a digitally settable current mirror in one embodiment, wherein the one current is decreased or increased, until it is identical to the second current. Alternatively, it is possible to adjust the currents not directly, but to send both currents through a resistor of a third type (which can, in a special case, also be one of the two first types), so that two different voltages drop across the resistor of the third type. For adjusting in the alternative scenario, a current is adjusted for so long, until both voltages are identical. Preferably, this adjusting is performed in a stress-free or at least low-stress state—for example during the wafer test, before the semiconductor wafer has been sawn and assembled in the housing. The reason for that is that by this adjusting merely the scattering of the layer resistors deposited in different technologies by different production steps is to be eliminated, but not the possible differences of the resistances, as they will occur due to an effect of mechanical stress. One of the feature according to an embodiment is that a statement about the doping of the resistors, which finally influences the temperature coefficient of the resistors, can be obtained through this type of adjusting, wherein it has to be noted that these variations of the temperature coefficients have overall the highest error influence on the final measurement result. If, for example, a resistor has a higher impedance than nominal, the reason is either that the doping is too low or the layer thickness of the resistor is too low. However, the thickness can be reproduced relatively exactly by the energy of the dopant ions during implantation, the mainly varying size is the dopant concentration.

The different dopant concentration is the main influencing factor, which determines the temperature coefficient of the resistors. Since the two technologically different resistors have different temperature coefficients, they each provide an output signal, which cannot be distinguished from a mechanical stress signal, at a different temperature than the adjusting temperature, which means the temperature where adjusting of the stress-dependent signal takes place. This adjusting is significant for the inventive concept, since a temperature error can only be calculated by simulation when the temperature coefficients of the two resistors remain well defined. In that case, the temperature error could be simulated or measured within a laboratory verification of some sample-ICs, in order to consider it in the subsequent calculating steps based on the measurement result.

If, however, the temperature coefficients scatter, as they do in reality due to statical fluctuations and process parameters changing during production, this causes a stress-dependent signal, which is not based on a mechanical stress actually acting on the semiconductor substrate.

The above-described adjusting helps in this context, since the adjusting signal is stored in the IC in an appropriate way, so that it provides information about deviation of the electric parameters of the resistors with regard to their nominal values, and that information can be used to correct the stress-dependent signal of the error influence, which this deviation causes. If a digitally controllable current mirror is used for adjusting, for example, the binary code used for controlling the current error can be stored in a memory (such as an EEPROM).

In a further embodiment, the first and second circuit block, but at least the resistors of the first and second circuit block and the useful element are interconnected, which means disposed spatially as close as possible on the semiconductor circuit substrate, to be subject to preferably identical stress and identical temperature. An interconnected arrangement of semiconductor circuit elements is common in analog circuit technology, the first resistor type can, for example, be divided into parts N1, N2, and the second resistor type into parts P1, P2, whereupon both resistors are disposed geometrically adjacent in the sequence N1, P1, N2, P2 or N1, P1, P2, N2. Alternatively, two-dimensional arrangements, such as common centroid or quadruple are common. Preferably, the just described elements are disposed in those areas of an IC where a homogeneous mechanical stress occurs (normal strain stress, no shear stress). This is particularly the case in the center of the IC, areas at the edge of the IC are to be avoided, wherein normally that area, which is not further away from the edges of the semiconductor chips than the chip thickness, is regarded as edge.

Further, the mentioned components are preferably placed on isotherms, which means areas which have to be on symmetry axes relative to the dominant heat source of the IC. In one embodiment, apart from the members for stress determination and the useful member, the Hall probe, the current supply of the Hall probe is also implemented on the semiconductor circuit substrate. If the current through the Hall probe is generated by a resistor, the same will also change under the influence of mechanical stress, whereby the magnetic sensitivity of the probe, which is the product of current-related magnetic sensitivity (a pure characteristic parameter of the Hall probe) and the current through the Hall probe, changes as well.

Preferably, the current through the Hall probe is generated with the help of p-diffusion/implantation resistors in L-shape. Thereby, a bandgap core for generating the current supplying the Hall probe and for generating the current sent through the resistor in the first circuit block for generating a stress-dependent signal, can be shared. Thus, on the one hand, chip area is saved, and, on the other hand, process scatterings can be minimized. The p-resistors generating the Hall probe supply current, and the n-doped Hall probe are then technological fully independent of each other, since they are produced in different process steps of the wafer production, so that the process-induced scatterings of the p-layer resistor and the current-related sensitivity of the n-Hall probe result in such a scattering of the magnetic overall sensitivity, wherein the scattering of this overall sensitivity is about 5 to 10%. For ICs with an absolute value accuracy of more than a few percent, this is unacceptable.

In one embodiment, this is compensated by adjusting the Hall probe supply current prior to putting into operation, wherein this adjusting can be coupled with adjusting the ratios of the currents of the first and second circuit block. If by adjusting the ratio of p- and n-current (n-current is that current, which is generated with the help of the n-resistor, the equivalent applies for the p-current) at a reference temperature and in a low-stress state is adjusted to its nominal value, the supply voltage dropping across the Hall probe is simultaneously adjusted to its nominal value, since the n-doped Hall probe behaves like the n-doped second resistor type. This applies particularly when the Hall probe is operated in spinning-current operation, where the current through the probe flows in orthogonal directions, as it is also the case in the L layout of the resistors. Thereby, strictly speaking, by this coupled adjusting, not only the magnetic sensitivity is adjusted, but substantially the supply voltage of the Hall probe. The magnetic sensitivity depends on the layer thickness and the charge carrier mobility of the Hall probe and its supply current—and not on the doping of the Hall probe.

In the above-described embodiment, the ratio of n- to p-resistor is adjusted, which means, for the Hall probe, adjusted to the expression "mobility multiplied by doping divided by layer thickness", which does not exactly correspond to the magnetic sensitivity. It is advantageous to be able to set the supply voltage of the Hall probe as exactly as possible to a nominal value with the described coupled adjusting, since then optimum advantage can be taken of the available operating voltage (even with temperature variation), and the noise of the overall system can thus be minimized. If an adjustment to the magnetic sensitivity is required or desired, further fine-adjusting of the useful signal can also be performed at another location in the signal-path of the IC.

In a further embodiment, the useful element (the Hall probe) and the n-doped resistor (the resistor of the second circuit block) are structured technologically identical (equal depth cross section, equal doping profiles), and ideally produced in the same process step, wherein the resistor of the first type consists of a p-doped region. In this configuration, the smallest process tolerances occur, since the p-doped resistor in {100} silicon shows very low dependence on mechanical stress, and the properties of the n-doped resistor mainly change in synchronization with the properties of the similarly structured Hall probe. The dependence of the magnetic sensitivity of the Hall probe on mechanical stress, for example, becomes smaller with doping higher than nominal—the same applies for the influence of the n-resistor by mechanical stress. This is caused by the fact that both piezo-Hall and piezo-resistive effect become less distinct with increasing doping. Something similar applies for the temperature dependences of the piezo-Hall and the piezo-resistive coefficients. As a modification of this advantageous embodiment of the inventive concept for compensating piezo-influences on an integrated semiconductor circuit, instead of the n-type L-resistor arrangement, an n-doped Hall probe in spinning current operation can be used, whereby additional chip area can be saved.

In an embodiment, the difference of a current through a first and second resistor type (n- and p-type) is used for forming the stress signal. This results in the advantage that the interpretation of the stress signal or the temperature dependence of the stress signal does not depend on the absolute temperature coefficients of the first and second resistor type, but only on their difference. If, for example, it is possible to produce an n-resistor with TC1=0.4%/° C. (wherein TC1 is the linear temperature coefficient of the first resistor) and a p-resistor with TC2=0.35%/° C., the difference signal interpreted as stress signal has a temperature dependence of only 0.05%/° C. A stress change of 22 MPA corresponds approximately to a measurement inaccuracy of 1% of an n-doped hall sensor in {100} silicon. A relative change of the resistor difference of the n- and p-type resistors of 0.6% corresponds approximately to the stress change of 22 MPA, according to a previous estimation, an error in the resistor difference of 0.6% is thus equal to a measurement inaccuracy of 1% of the considered Hall sensor arrangement. By forming the difference of n- and p-resistor, a relative change of the resistor difference of 0.6% is only achieved at a temperature difference of $$0.6\%/(0.4\%/° C.-0.35\%/° C.)=12° C.$$

to the reference temperature, which means the temperature where both resistors or currents, respectively, have been adjusted.

On the one hand, the temperature error as a whole is reduced, particularly, the requirements for a temperature sensor may be simplified, based on the temperature measurement of which the error can be corrected: for the above-described values the temperature merely has to be detected with an accuracy of about 10° C. (Particularly, the temperature sensor itself is to remain uninfluenced by mechanical stress and it may not have a drift of the output signal which is higher than 10° C. during its whole life span).

The integration of a temperature sensor in the Hall sensor system is inevitable, as the above numerical example shows. If, for example, adjusting is performed at room temperature=20° C., and the IC is also to operate properly at −50° C. with the desired accuracy, the maximum temperature difference between usage and adjusting temperature is 70° C. If, as described above, the two resistors in the linear temperature coefficients are to differ only by 0.05%/° C., the formation of a stress-dependent signal provides a signal, which deviates $$70° C.*0.05\%=3.5\%$$

from the correct absolute value, which corresponds to a percentage deviation of the mechanical stress of $$3.5\%/(2.75\%/GPA+24.4\%/GPA)=129 \text{ MPA}.$$

This mechanical stress would change the current-related sensitivity of the Hall probe (which means the useful signal of such an IC) by $$45\%/GPA \times 0.129 \text{ GPA}=5.8\%.$$

However, modern Hall-sensor-ICs need to have a stability of ±1%, which cannot be obtained without compensation of the same due to the temperature error of the stress-dependent signal, since the above estimated error is about six to ten times too high.

This temperature error of the stress-dependent signal can be eliminated mathematically to a great extent, when the temperature is detected and temperature correction is applied to the stress-dependent signal. The stress-dependent signal has to be multiplied with $$(1+(TC1p-TC1n)\times(Tj-Tref)),$$

wherein Tj is the temperature at the chip (junction temperature), Tref is the chip temperature during adjusting of the first and second circuit block, and TC1p, TC1n are the linear temperature coefficients of the layer resistors of the p- and n-doped resistor type. Here, the following applies:

$$TC1n-TC1p)*(Tj-Tref)=(0, 4\%/° C.-0, 35\%/° C.)*(-50° C.-20° C.)=-3, 5\%,$$

Thus, the difference of the linear temperature coefficients of the first and second resistor type is calculated exactly.

Process-induced scattering of the linear temperature coefficients of nominal value as well as the error of temperature measuring remain as the only errors: these errors are at least magnitude smaller than without temperature correction calculation, and thus sufficiently small that a significant increase of the piezo-sensitivity of a useful signal can be expected from a stress measurement.

In one embodiment, the temperature measurement is determined by a voltage dropping across the p-type resistor on a semiconductor substrate. For this purpose, a bandgap core is used to generate a current, whose current strength is proportional to the temperature on the semiconductor chip. As measure for the temperature on the chip, the voltage dropping across the p-type resistor is used, since the p-type resistor has a small temperature dependence, as it is known, and thus the voltage across the resistor can also be considered proportional to the temperature. The inventive temperature measurement is particularly advantageous, since here the same bandgap core, which is also used for forming the stress signal, can be used again, whereby chip area and production costs can be saved.

In the following, the discussion of FIGS. 3a-b will be omitted, since they have already been discussed in detail in the description of the prior art.

Figure 1:
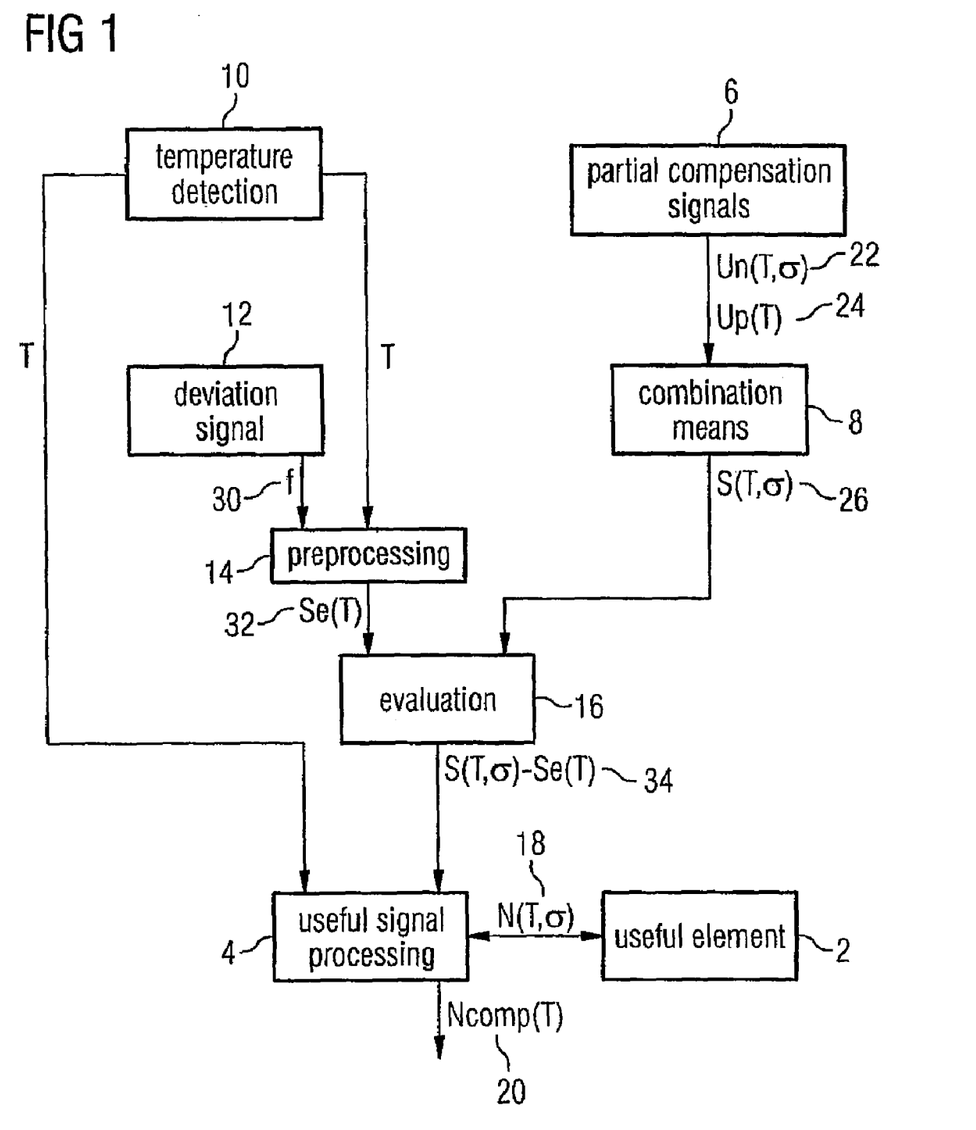
FIG. 1 is a block diagram of the inventive concept for compensating piezo-influences.

FIG. 1 shows a block diagram, based on which the inventive concept for compensating piezo-influences on a semiconductor circuit will be described.

The useful element 2, a useful signal processing means 4, a means for providing a first and a second partial compensation signal 6, a combination means 8, a temperature detection means 10, a means for providing a deviation signal 12, a preprocessing means 14 as well as an evaluation means 16 are illustrated.

The temperature detection means 10 is connected to an input of the preprocessing means 14 via a first output, and to the useful signal processing means 4 via a second output. The means for providing a deviation signal 12 is connected to a data input of the evaluation means 14 via a data output. The means for providing a first and a second partial compensation signal 6 is connected to a data input of the combination means 8 via a data output. The data output of the combination means 8 is connected to a first data input of the evaluation means 16, a second data input of the evaluation means 16 receives the data, which the preprocessing means 14 provides at its data output. The data output of the evaluation means 16 is connected to a data input of the useful signal processing means 4, a further data input of the useful signal processing means 4 is connected to the data output of the useful element 2.

The aim, which the inventive concept follows, is to correct the useful data 18 (N(T,σ)) provided by the useful element 2, which depend on the temperature T and the mechanical stress σ acting on the semiconductor structure in a spurious way, via the useful signal processing means 4, such that the result signal 20 (Ncomp(T)) output by the whole semiconductor circuit is mostly freed from the stress-dependent error portion, so that the same only shows a temperature dependence, which is assumed to be known.

In order to perform this correction, first, a stress signal has to be measured, and the same has to be corrected for the temperature effects, or effects that occurred due to varying processing parameters during the production of the semiconductor circuit, respectively.

Therefore, the means for providing (6) transmits a first partial compensation signal 22 and a second partial compensation signal 24 to the combination means 8, which combines the first partial compensation signal 22 and the second partial compensation signal 24 to an intermediate compensation signal 26 (S(T,σ)), which is transmitted to the evaluation means 16.

Thereby, the intermediate compensation signal 26 depends on the mechanical stress σ and the temperature at the time of the measurement T. In the evaluation means 16, the intermediate compensation signal 26 is freed from signal portions based on a corruption of the first partial compensation signal 22 and the second partial compensation signal 24, which are again caused by varying process parameters during the production of the semiconductor chip.

For that purpose, a deviation signal 30(f) is provided by the means for providing a deviation signal, which describes the deviation of a ratio of the first partial compensation signal 22 to a second partial compensation signal 24, which has been determined in a stress-free state, which means typically during wafer production, and at reference temperature. Thus, this deviation signal 30 describes the process fluctuation-induced deviation of the first and second partial compensation signals (22 and 24), which can be different for every produced chip. Since the operating temperature of the semiconductor chip will generally not correspond to the reference temperature, first, the deviation signal 30 has to be preprocessed into a corrected deviation signal 32 (Se(T)) by the preprocessing means 14, for which the preprocessing means 14 has to additionally consider the temperature provided by the temperature detection means 10. Thus, the preprocessing means 14 extrapolates the deviation signal 30 obtained at a predetermined temperature and low stress, at the temperature T prevailing at the time of the measurement, so that the corrected deviation signal 32 describes the error portion of a stress signal, which occurs during production due to process errors.

Based on the corrected deviation signal 32 and the current intermediate compensation signal 26, the evaluation means 16 calculates a compensation signal 34, which is freed from production process errors and thus only has a dependence on mechanical stress as well as a known temperature dependence.

The correction of useful data 18 provided by the useful element 2 is based on the fact that the temperature and stress dependence of the useful data 18 is known, so that the useful data 18 can be freed from the useful signal processing means 4 of the error signal portion, which is caused due to the mechanical stress, to determine a result signal 20, which is mostly independent of the mechanical stress on the semiconductor.

Figure 2:
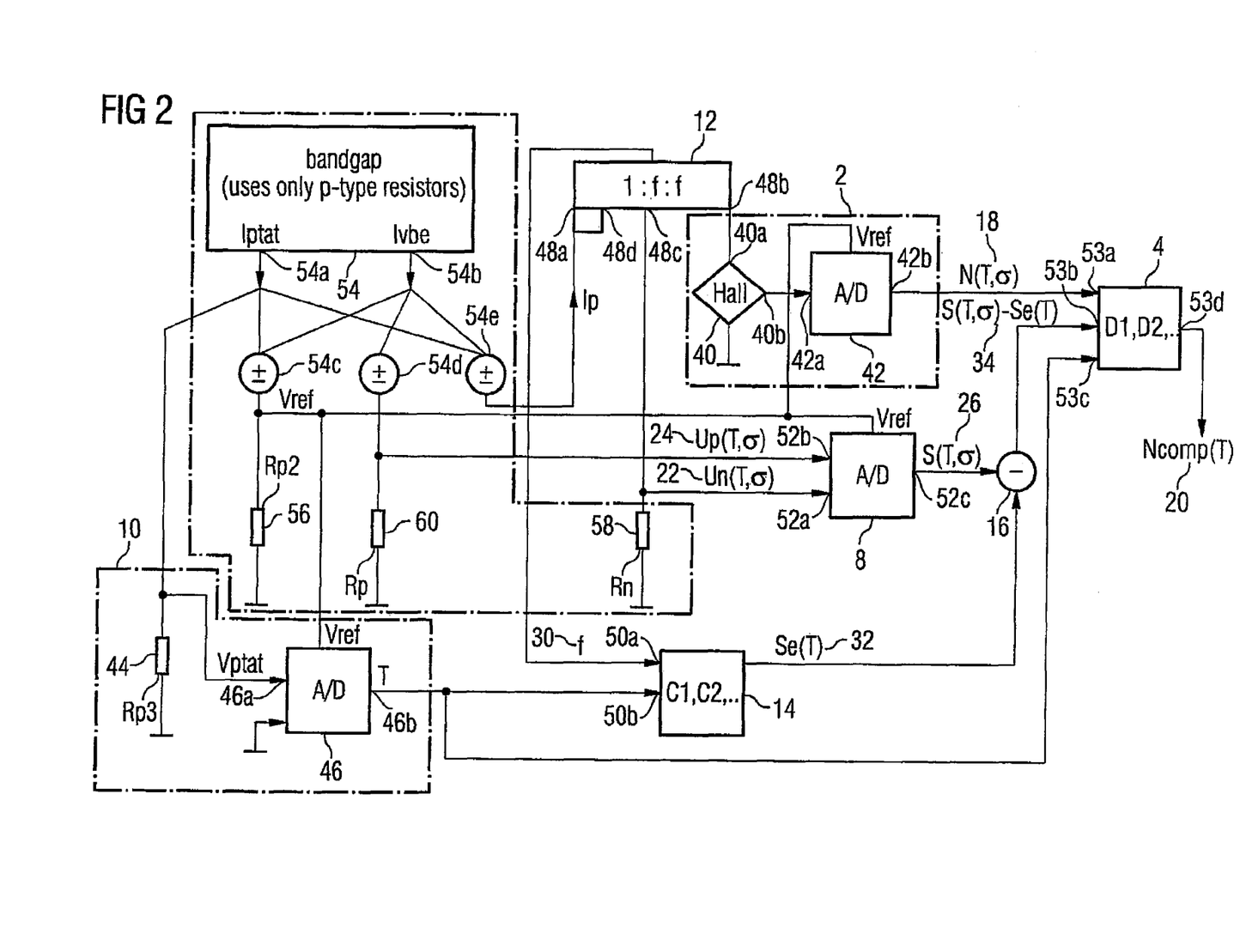
FIG. 2 is a semiconductor circuit for compensating the piezo-influences on the measurement result of a Hall sensor.

FIG. 2 shows a circuitry for performing the concept for determining a compensation signal in a semiconductor circuit. The functional units in FIGS. 1 and 2 with identical function range have the same reference numbers.

Thus, FIG. 2 also shows the useful element 2, the useful signal processing means 4, the means for providing a first and a second partial compensation signal 6, the combination means 8, the temperature detection means 10, the means for providing a deviation signal 12, the preprocessing means 14 as well as the evaluation means 16.

Here, the useful element 2 consists of a Hall sensor 40 with a supply current input 40a and a voltage output 40b, as well as an analog/digital converter with an analog input 42a and a digital output 42b.

The temperature detection means 10 consists of a p-type (Rp3) temperature resistor 44 and an analog/digital converter 46 with an analog input 46a and a digital output 46b.

The means for providing a deviation signal 12 is realized as an adjustable current mirror circuit, the same comprises a supply current input 48a, a feeding current output 48b, a further feeding current output 48c as well as an adjusting signal output 48d.

The preprocessing means 14 is formed as digital calculating circuit with a first input 50a and a second input 50b, as well as data output 50c.

The combination means 8 is formed as analog/digital converter with a first analog input 52a and a second analog input 52b, wherein the same additionally has a digital output 52c.

The useful signal processing means 4 is formed as digital calculating circuit, which has a first data input 53a, a second data input 53b and a third data input 53c, as well as digital data output 53d.

The means for providing a first partial compensation signal 22 and a second partial compensation signal 24 comprises a bandgap circuit 54, a p-type reference resistor 56 of, a first n-type compensation resistor 58 and a second p-type compensation resistor 60. The bandgap circuit 54 for generating different currents has several current connection points 54a-54e.

The temperature resistor 44 is connected between the first current connection point 54a of the bandgap circuit 54 and ground. The analog/digital converter 46 is connected in parallel to the temperature resistor 44, wherein the analog input 46a of the analog/digital converter 46 is connected to the supply voltage side terminal of the temperature resistor 44.

The reference resistor 56 is connected between the third current connection point 54c and ground. The second compensation resistor 60 is connected between the fourth connection point 54d and ground, the fourth current connection point 54e is connected to the supply current input 48a and the current mirror circuit 12.

The first compensation resistor 58 is connected between the second feeding current output 48c of the current mirror circuit 12 and ground, the first feeding current output 48b of the current mirror circuit 12 is connected to the current input 48a of the Hall sensor 40, which is connected between the first feeding current output 48b of the current mirror circuit 12 and ground. The voltage output 40b of the Hall sensor 40 is connected to the analog input 42a of the analog/digital converter 42. The digital output 42b of the analog/digital converter 42 is connected to the first data input 53a of the useful signal processing means 4. The supply current side terminal of the second compensation resistor 60 is connected to the second analog input 52b of the analog/digital converter 8, the supply current side terminal of the first compensation resistor 58 is connected to the first analog input 52a of the analog/digital converter 8, wherein the digital output 52c of the analog/digital converter 8 is connected to a first input of the evaluation means 16, whose second data input is connected to the data output 50c of the preprocessing means 14. The first data input 50a of the preprocessing means 14 is connected to the adjusting signal output 4b of the current mirror circuit 12, wherein the second data input 50b is connected to the digital output 46b of the analog/digital converter 46, which is further connected to the third data input 53c of the useful signal processing means 4.

The data output of the evaluation means 16 is connected to a second data input 53b of the useful signal processing means 4, the stress-compensated useful signal 20 can be tapped at the data output 53 of the useful signal processing means 4.

Additionally, the analog/digital converters 8, 42 and 46 have an input where a reference voltage Vref is applied, which is important for the mode of operation of the A/D converter, whose existence, however, is not substantial for the inventive determining of a compensation signal, so that the presence of the reference voltage Vref is merely mentioned here.

In one embodiment, which is shown in FIG. 2, and where the measurement signal of a Hall probe is corrected for the influences by mechanical stress, all currents required for the operation of a circuit can be generated by a bandgap circuit 54. Via the known bandgap circuit principles, the temperature course of currents can be formed almost arbitrarily, by mixing current portions Iptat and Ivbe, as they can be tapped at the current connection point 54a and 54b, wherein Iptat is a current proportional to the absolute temperature, and Ivbe decreases linearly with increasing temperature. At the current connection point 54c, the currents are combined such that they are as temperature independent as possible. At the current connection point 54d the currents are also combined such that they are as independent as possible of the environmental temperature, while at the current connection point 54e, a current Ip is generated within the bandgap circuit by a p-type resistor laid out in L-shape, which has a freely selectable temperature dependence T and a dependence on the sum of the nominal stress components on the chip level σ.

The voltage drop Vref, which is generated by the current tapped at the current connection point 54c across the p-type reference resistor 56, serves as reference voltage for the analog/digital converters 8, 42 and 46, which may require this reference voltage for digitalization. A voltage Vptat, which is proportional to the temperature, is generated at the temperature resistor 44 by the voltage drop, which is generated by the temperature proportional current, which is tapped at the current connection point 54a. The temperature proportional voltage Vptat is applied to the analog input 46a of the analog/digital converter 46, so that the temperature information T is available in digital form at the digital output 46b of the analog/digital converter 46.

The first partial compensation signal 22 and the second partial compensation signal 24, by means of which the stress determination is performed, form the voltage drops across the first compensation resistor 58 and the second compensation resistor 60, wherein the first partial compensation signal 22 (Un(T,σ)) and the second partial compensation signal 24 (Up(T,σ)) are applied to the analog inputs 52a and 52b of the analog/digital converter 8, from which the same generates a digital output signal:

$$S=(Up-Un)/Vref*FSR,$$

wherein FSR in this case indicates the full scale range of the A/D converter. For example, for a 10 bit converter, the following applies:

$$FSR=2(10-1)=1023.$$

Thus, the stress signal S(T,σ) depends on T and σ, as well as on the adjusting signal 30 (f), whose generation will be discussed below.

The adjusting process, is thereby performed via the variation of the current Ip, which is impressed into the first compensation resistor 58 (Rn). To allow this, the current Ip tapped at the current terminal point 54a of the bandgap circuit 54 is impressed via a trimmable current mirror 12, which comprises the inventive means for providing a deviation signal. The relation of the current applied to its supply current input 48a with the output current applied to its feeding current outputs 48a and 48c can be freely adjusted via the current mirror 12, thereby, f indicates the current mirror factor=output current/input current. The current mirror factor f is applied as deviation signal 30 to the data input 50a of the preprocessing means 14. The current output at the feeding current output 48c is impressed into the first compensation resistor 58, whereby the voltage $Un(T,\sigma)$ drops across the same as first partial compensation signal 22, and wherein the following applies:

$$Un(T,\sigma)=Ip(T,\sigma)*Rn(T,\sigma)*f.$$

The same supply current is tapped at the feeding current output 48b and applied as Hall probe supply current for the Hall probe 40 to its current input 40a. This has the advantage that then the Hall probe supply current is highly independent of mechanical stress, since the same has been generated within the bandgap circuit 54 via an L-shaped p-type resistor, which only has a low piezo-dependence of 2.75%/GPa.

In the adjusting process, the deviation signal 30(f) is adjusted such that at a reference temperature Tref, where adjusting takes place, and in a possibly low-stress state (for example on wafer level with small stress σ1), the stress signal disappears, so that the following applies:

$$S(Tref,\sigma1)=[(Up(Tref)-Rn(Tref,\sigma1)*f*$$

$$Ip(Tref,\sigma1))/Vref] \times FSR.$$

From that, it follows that:

$$f=Up(Tref)/(Rn(Tref,\sigma1)*Ip(Tref,\sigma1)).$$

Thereby, the temperature dependence of Up and Un in the stress-free state is preferably to be chosen such that Up−Un=0.

This condition can be fulfilled in practice only for an approximation, so that, for example, the first order temperature coefficient disappears, which means for T=Tref applies:

$$d/dT(Up-Un)=0.$$

Thus, even after adjusting is performed, an output signal S< >0 will result at T< >Tref, with arbitrary temperatures in a stress-free state, which is indicated as temperature error and designated as Se, wherein the following applies:

$$Se(T)=[Up(T)-Rn(T,0)*Ip(T,0)*Up(Tref)/Rn(Tref,\sigma1)\\*Ip(Tref,\sigma1))]/Vref*FSR.$$

Additionally, this temperature error depends on f, since the current mirror relation f is a measure for the scattering Rn/Rp from the nominal value and thus a measure for the difference of the linear temperature coefficients of the layer resistors. Thus, generally, Se=Se(T,f) applies. This function is determined by laboratory characterization and approximated, for example, as power series as follows:

$$Se \approx C1*T+C2*f+C3*T*f+ \ldots ,$$

wherein C1, C2, C3 result from laboratory characterization.

This stress error signal is calculated in the circuit in FIG. 2 by the preprocessing means 14, due to that the same obtains the deviation signal f at its first data input 50a and the temperature signal T at its second data input 50b. Thereby, T is generated by the analog/digital converter 46, so that the following applies for the digital temperature signal:

$$T=Vptat/Vref*FSR.$$

Thus, the signal Se(T) describes the deviation of the ratio of the compensation resistors 58 and 60 at the current temperature T. In order to be able to free the stress signal $S(T,\sigma)$ measured at this temperature T from this error portion, the corrected deviation signal 32 (Se(T)) and the intermediate compensation signal 26 $(S(T,\sigma))$ are applied to the two inputs of the evaluation means 16, which forms the difference of the signals, which means S(T)−Se(T). Thus, the compensation signal 34, S(T)−Se(T), is a signal which is proportional to the mechanical stress σ, but has a complicated T dependence, since the involved piezo-constants are T dependent.

The useful signal 18 $(N(T,\sigma))$, which is the measurement signal of the Hall sensor 40 digitalized by the analog/digital converter 42, which is provided by the same at its voltage output 40b, is then calculated with (S—Se), so that the stress dependence is singled out. One of many possibilities for the calculating rule to be used for that is, for example:

$$Ncomp(T)=N(T,\sigma)*(1+D1*(S-SE)+D3*(S-SE)*T+ \ldots$$

wherein the constants D1, D2, D3, . . . have to be known from a laboratory characterization. The signal Ncomp(T) provided at the digital data output 53d of the useful signal processing means 4 is also mostly freed from influences of the mechanical stress and merely dependent on the temperature.

Although two analog/digital converters 46 and 8 have been used for the analog/digital conversion of the temperature signal and the stress signal in the embodiments described in FIG. 2, alternatively, only a single analog/digital converter can be used, when the same is operated in time-multiplex operation.

Although the inventive embodiment, which has been described with regard to FIG. 2, proposes that all resistors mentioned there are laid out in L-shape, this is not obligatory in an alternative embodiment. Thereby, at least those p-type resistors, which generate the current Ip in the bandgap circuit 54, and the reference resistors 58 and 60 (Rn and Rp) have to be laid out in L-form. All other resistors only have to be laid out in L-form when those resistors defining the currents within the bandgap circuit 54 are also laid out in L-form. However, in an alternative embodiment, it would also be possible to use simple resistors in the bandgap circuit 54, which define the currents through the reference resistor 56 and the temperature resistor 44, if then the reference resistor 56 and the temperature resistor 44 are similar simple resistors. They can even be resistors of a different type (e.g. polysilicon resistors). This is possible since merely the generation of a voltage Vref and Vptat, which are as exact as possible, counts in the reference resistor 56 and the temperature resistor 44.

In an alternative embodiment, the chip temperature detection is performed in a low-stress way, since all resistors participating in the temperature measurement are structured in a similar way and react only to nominal strain stress (polyresistors or L-shaped diffusion resistors). With reduced accuracy requirements, the same can also be p-diffusion or implantation resistors arranged 45° to the flat of the wafer.

Further, a low-stress detection of the chip temperature is possible in another advantageous variation, when pnp-substrate transistors are used within the bandgap circuit 54 at least for that part of the circuit, which generates the temperature proportional current Iptat, since the same are particularly stress resistant and technologically stable in {100} material.

As an alternative to the embodiment shown in FIG. 2, the stress sensor signal 26 can also be formed such that it is already precompensated with regard to its temperature dependence.

The inventive analog adjusting of the Hall probe current and the stress sensor, as described above, can also be omitted, when the measurement value is stored in an internal measurement value memory and later calculated in a digital way. Thereby, omitting adjusting is possible (for example, for space-saving reasons and when the absolute value accuracy resulting from the ratio of n- to p-resistor is insignificant for the specific application). Thereby, the measurement value for Rn and Rp can be, for example, stored explicitly in a digital way, in order to use the same for a later calculation of the compensation signal. An estimation how much the temperature coefficient of the ratio of a first to second resistor type differs from the nominal value can be made through such an adjusting signal, and this estimation value can be considered in the calculating steps, in order to increase the accuracy of the stress signal in that way.

In an alternative embodiment with increased accuracy requirements, the stress-dependent VBE portion in the sensor is corrected in the same way for high-precision bandgap-based temperature sensors and reference voltage sources, and the currents in the bandgap core are also corrected in a stress-dependent way.

In an alternative embodiment, when using high-precision analog/digital converters or digital/analog converters, the associated reference current or the reference voltage, as just described, can also be corrected.

The circuit block, which operates as combination means 8 and provides the stress signal, forms the stress signal in the present embodiments by forming the difference of two partial compensation signals. Alternatively, different types of stress signal formation are possible, on the one hand, the difference or quotient, respectively, of the first and second current can be formed directly. As alternative embodiment, the first current and the second current can be impressed on a resistor of an arbitrary resistor type, whereby a first and a second voltage occur, whose difference or quotient, respectively, can be measured.

Alternatively, the first current can be coupled into a resistor of the second type. Thereby, a second voltage occurs, which depends on mechanical stress. The same can be compared with a third voltage, which does not depend on the mechanical stress, which can be obtained conventionally by generating a current via a bandgap circuit and coupling it into a resistor, whereby the resistor is of the same type as the one used in the bandgap. The third voltage can then also have an appropriately chosen temperature course, which corresponds to each of the second voltage in the stress-free state.

Preferably, the combination means 8 comprises an analog/digital converter, which outputs a digital code, which results from the difference of two partial voltages divided by a reference voltage.

The reference voltage can be generated as described with regard to FIG. 2 or can also be supplied to the system from the outside.

In the above-described embodiment, the correction of the signals is performed via digital calculating circuits, however, it is easily possible to perform the same via analog calculating circuits, such as multipliers or adders.

The above specification has been described mainly in connection with a Hall probe. However, it should be noted that all semiconductor circuit elements having a piezo-dependence, such as, for example, a piezo-resistive dependence, a piezo-MOS dependence, a piezo-junction dependence, a piezo-Hall dependence or a piezo-tunnel dependence from the mechanical stress state of the semiconductor substrate, can be compensated with regard to their stress dependence by the inventive compensation method.

Particularly, apart from Hall probe elements, other magnetic field sensitive elements can be used as magnetic field sensor elements, such as field plates, xMR sensor elements (AMR, GMR, TMR, CMR sensor elements; AMR=anisotropic magneto resistance, GMR=giant magneto resistance, TMR=tunnel magneto resistance, CMR=collosal magneto resistance), magnetic resistors, magneto transistors (MAGFETs), giant planar hall effect sensor elements, spin transistors, GMI elements (GMI=giant magnetic impedance), MR sensor elements (MR=magneto resistance) or magneto diodes, wherein the above list is not considered to be exhaustive.

While this invention has been described in terms of several preferred embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

What is claimed is:

1. An apparatus for determining a compensation signal, comprising:
   a provider for providing first and second partial compensation signals, wherein the first and second partial compensation signals have a different mechanical stress dependence;
   a combiner for combining the first and second partial compensation signals into an intermediate compensation signal;
   a temperature detector for detecting a temperature of a semiconductor circuit substrate;
   a provider for providing a deviation signal, wherein the deviation signal comprises information about the deviation of a real ratio of the first and second partial compensation signals from a set ratio of the same at a reference temperature;
   a preprocessor, which is implemented to form a corrected deviation signal considering the detected temperature from the deviation signal, under consideration of the detected temperature; and
   an evaluator, which is implemented to provide the compensation signal based on the intermediate compensation signal and the corrected deviation signal, which is a measure for the mechanical stress acting on the semiconductor circuit substrate.

2. The apparatus according to claim 1, further comprising:
   a useful element integrated on a semiconductor circuit substrate and formed to provide a useful signal in dependence on a physical quantity to be detected, wherein the useful signal comprises a useful signal portion and an error portion; and
   a useful signal processor, which is implemented to form a corrected useful signal from the useful signal, under consideration of the detected temperature and the compensation signal, wherein an error portion caused by the mechanical stress in the corrected useful signal is reduced.

3. The apparatus according to claim 1, wherein the provider for providing first and second partial compensation signals comprises a first circuit element with a first stress-dependent electric characteristic and a second circuit element with a second stress-dependent electric characteristic.

4. The apparatus according to claim 3, wherein the first circuit element and the second circuit element are resistive elements, and wherein the first stress-dependent electric characteristic and the second stress-dependent characteristic are based on the piezo-resistive effect.

5. The apparatus according to claim 3, wherein the first circuit element comprises an n-type implantation or diffusion resistor, and wherein the second circuit element comprises a p-type implantation or diffusion resistor.

6. The apparatus according to claim 3, wherein the first circuit element comprises two elongated partial elements, which are electrically connected in parallel or in series, wherein the partial elements are arranged orthogonally to each other with regard to a main current flow direction.

7. The apparatus according to claim 3, wherein the second circuit element comprises two elongated partial elements, which are electrically connected in parallel or in series, wherein the partial elements are arranged orthogonally to each other with regard to a longitudinal axis, so that a main current flow direction along the longitudinal axis of the partial elements runs perpendicular for the two partial elements.

8. The apparatus according to claim 3, which comprises a bandgap circuit, which is implemented to impress first and second currents into the first and second circuit elements, to obtain the first and second partial compensation signals.

9. The apparatus according to claim 3, wherein the provider for providing a deviation signal is implemented to provide the deviation of a real ratio of the first stress-dependent electric characteristic of the first circuit element and the second stress-dependent electric characteristic of the second circuit element from a set ratio as deviation signal, wherein the deviation of the real ratio from the set ratio is based on production tolerances of the first and second circuit elements.

10. The apparatus according to claim 9, wherein the provider for providing a deviation signal is implemented to provide the difference of the first stress-dependent electric characteristic and the second stress-dependent electric characteristic as deviation signal.

11. The apparatus according to claim 1, wherein the provider for providing a deviation signal is implemented to provide the deviation signal in the form of a digital code.

12. The apparatus according to claim 1, wherein the provider for providing a deviation signal comprises a storage memory for storing the deviation signal.

13. The apparatus according to claim 1, wherein the combiner is implemented to form the intermediate compensation signal from a linear combination of the first and second partial compensation signals.

14. The apparatus according to claim 1, wherein the combiner is implemented to form the intermediate compensation signal from the difference of the first and second partial compensation signals.

15. The apparatus according to claim 1, wherein the preprocessor is implemented to form the corrected deviation signal by inserting the deviation signal and the temperature into a functional rule, wherein the functional rule considers a temperature dependence of the deviation signal.

16. The apparatus according to claim 15, wherein the preprocessor is implemented to approximate the functional rule as power series.

17. The apparatus according to claim 1, wherein the evaluator is implemented to form the compensation signal by combining the intermediate compensation signal and the corrected deviation signal.

18. The apparatus according to claim 17, wherein the evaluator is implemented to determine the compensation signal by forming the difference of the intermediate compensation signal and the corrected deviation signal.

19. The apparatus according to claim 2, wherein the useful element comprises a sensor element, which is implemented to provide a sensor signal as useful signal.

20. The apparatus according to claim 19, wherein the sensor element comprises a Hall element, which is implemented to provide the Hall voltage as sensor signal.

21. The apparatus according to claim 2, wherein the useful signal processor is implemented to form the corrected useful signal by combining the useful signal and the compensation signal as well as the temperature, wherein a temperature-dependent and stress-dependent useful signal characteristic of the useful element is considered.

22. The apparatus according to claim 21, wherein the useful signal processor is implemented to perform the combination by inserting the temperature, the useful signal and the compensation signal into a functional rule.

23. The apparatus according to claim 22, wherein the useful signal processor is implemented to approximate the functional rule as power series.

24. A method for determining a compensation signal, comprising the steps of:
providing first and second partial compensation signals, wherein the first and second partial compensation signals have a different mechanical stress dependence;
detecting a temperature of a semiconductor circuit substrate;
combining the first and second partial compensation signals into an intermediate compensation signal;
providing a deviation signal, wherein the deviation signal comprises information about the deviation of a real ratio of the first and second partial compensation signals from a set ratio of the same at a reference temperature;
preprocessing the deviation signal to form a corrected deviation signal considering the detected temperature from the deviation signal under consideration of the detected temperature;
evaluating the intermediate compensation signal to provide a compensation signal based on the intermediate compensation signal and the corrected deviation signal, which is a measure for the mechanical stress acting on the semiconductor circuit substrate; and
outputting the compensation signal.

25. The method according to claim 24, wherein providing the detection signal comprises adjusting the first and second partial compensation signals, wherein during adjusting a ratio of the first and second partial compensation signals is set such that the same corresponds to a set ratio, so that an adjusting factor, which controls adjusting, is a measure for the deviation of the real ratio from the set ratio.

26. The method according to claim 25, wherein adjusting is performed in the stress-free state on wafer level during production of a semiconductor circuit.

* * * * *